(12) United States Patent
Mangat et al.

(10) Patent No.: US 8,592,103 B2
(45) Date of Patent: Nov. 26, 2013

(54) EXTREME ULTRAVIOLET MASKS HAVING ANNEALED LIGHT-ABSORPTIVE BORDERS AND ASSOCIATED FABRICATION METHODS

(75) Inventors: Pawitter Mangat, Clifton Park, NY (US); Lei Sun, Albany, NY (US); Oleg Kritsun, Sunnyvale, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 134 days.

(21) Appl. No.: 13/190,270

(22) Filed: Jul. 25, 2011

(65) Prior Publication Data
US 2013/0029253 A1 Jan. 31, 2013

(51) Int. Cl.
G03F 1/24 (2012.01)
G03F 1/22 (2012.01)

(52) U.S. Cl.
USPC ............................................................. 430/5

(58) Field of Classification Search
USPC .................. 430/5, 330, 394; 378/35
See application file for complete search history.

(56) References Cited

U.S. PATENT DOCUMENTS

2011/0151358 A1* 6/2011 Kamo ................................ 430/5

OTHER PUBLICATIONS

Robert S. Rosen et al., "Silicide Layer Growth Rates in Mo/Si multilayers," Applied Optics, Dec. 1, 1993, vol. 32, No. 34, pp. 6975-6980.

Takashi Kamo et al., "Thin Absorber EUV Mask with Light-Shield Border of Etched Multilayer and its Lithographic Performance," Proc. of SPIE, vol. 7748, 774805, 2010, pp. 1-10.

J.M. Slaughter et al., "Interfaces in Mo/Si Multilayers," X-Ray/EUV Optics for Astronomy, Microscopy, Polarimetry, and Projection Lithography, SPIE vol. 1343, 1990, pp. 73-82.

Hwan-Seok Seo et al., "Absorber Stack Optimization in EUVL Masks: Lithographic Performances in Alpha Demo Tool and Other Issues," Extreme Ultraviolet (EUV) Lithography, Proc. of SPIE vol. 7636, 76360X, 2010, pp. 1-9.

Pei-Yang Yan et al., "EUVL ML Blank Fiducial Mark Generation via Local Heating," Emerging Lithographic Technologies VIII, Proceedings of SPIE vol. 5374, 2004, pp. 254-260.

Takashi Kamo, "EUVL Practical Mask Structure with Light Shield Area for 32nm Half Pitch and Beyond," Photomask Technology, Proc. of SPIE vol. 7122, 712227, 2008, pp. 1-11.

D.L. Windt et al., "Interface Imperfections in Metal/SI Multilayers," Journal of Applied Physics, vol. 71 (6), Mar. 15, 1992, pp. 2675-2678.

Takashi Kamo et al., "Thin-Absorber Extreme-Ultraviolet Lithography Mask with Light-Shield Border for Full-Field Scanner: Flatness and Image Placement Change Through Mask Process," J. Micro/Nanolith. MEMS MOEMS 9(2), 2010, pp. 1-10.

* cited by examiner

*Primary Examiner* — Stephen Rosasco
(74) *Attorney, Agent, or Firm* — Ingrassia Fisher & Lorenz, P.C.

(57) ABSTRACT

Embodiments of a method for fabricating an extreme ultraviolet (EUV) mask having a die pattern area are provided, as are embodiments of a method for fabricating an integrated circuit utilizing an EUV mask and embodiments of an EUV mask. In one embodiment, the EUV mask fabrication method includes obtaining an EUV mask blank including a substrate and a multi-layer (ML) reflector disposed over the substrate, and annealing localized portions of the ML reflector to produce an EUV light-absorptive border extending at least partially around an outer perimeter of the die pattern area.

13 Claims, 6 Drawing Sheets

EXTREME ULTRAVIOLET MASKS HAVING ANNEALED LIGHT-ABSORPTIVE BORDERS AND ASSOCIATED FABRICATION METHODS

TECHNICAL FIELD

The present invention relates generally to lithography and, more particularly, to extreme ultraviolet masks having annealed light-absorptive borders, as well as to methods for fabricating extreme ultraviolet masks and semiconductor devices.

BACKGROUND

Extreme ultraviolet ("EUV") lithography is an emerging technology enabling the fabrication of semiconductor devices having critical dimensions less than 28 nanometers (nm) in width. In contrast to conventional lithographical techniques, EUV lithography utilizes extreme ultraviolet light to transfer a circuit layout pattern from a reflective EUV photomask (referred to herein as an "EUV mask" and also commonly referred to as a "reticle") to a semiconductor die. In one common implementation, the EUV mask includes a substrate, a multi-layer ("ML") reflector formed over the substrate, and an absorber stack formed over the ML reflector. The ML reflector and the absorber stack are tuned to be predominately reflective and absorptive, respectively, of extreme ultraviolet light at a chosen EUV wavelength, which is typically about 13.5 nm. Utilizing conventional lithography, the absorber stack is patterned to expose selected areas of the underlying ML reflector corresponding to the desired circuit layout. The remaining portions of the absorber stack absorb the EUV radiation. During EUV lithography, EUV light is projected through a system of mirrors onto the EUV mask at a slight angle relative to the mask surface normal (commonly referred to as an "angular exposure" or "off-axis illumination"). Reticle masking blades or, more simply, "REMA blades" are commonly included in the exposure system to block the extra radiation outside the active semiconductor devices. The light impinging upon the REMA blades is primarily absorbed; while the light impinging upon the exposed regions of the ML reflector is primarily reflected from the EUV mask onto a layer of photoresist, which is then utilized to impart the desired circuit layout to the semiconductor die. Leakage of EUV radiation occurs during exposure of adjacent dies. This primarily is caused by residual absorber reflectivity and REMA blade instability and out of band light reflections, resulting in over exposure around die edge impacting edge CD controls.

Due to the angular exposure utilized during EUV lithography, a shadow effect occurs wherein small portions of the incoming and outgoing EUV light are inadvertently blocked by the upper sidewall edges of the absorber pattern. As the severity of the shadow effect varies in relation to orientation of the absorber pattern relative to the EUV light, the shadow effect results in a horizontal-to-vertical bias in critical dimensions. The shadow effect can be minimized by reducing the thickness or height of the absorber film; however, this also reduces the absorptivity of the absorber material. Furthermore, this effect is additionally magnified near the edges of the semiconductor die due to the positional inaccuracies of the REMA blades. Additional unwanted EUV light from the REMA blades may reflect an undesirably high amount (e.g., 2-3%) of EUV light at the selected wavelength, in addition to a certain amount of out-of-band light near the periphery of the semiconductor device. Image resolution may thus become blurred or undesirably diffuse at the outer edges of an exposure reflected from the EUV mask. When semiconductor dies are sequentially printed utilizing such an EUV mask, the dies may be overexposed multiple times along their neighboring edges resulting in uncontrolled variations in the critical dimensions.

At least two solutions have been proposed to reduce the reflectivity of EUV masks along the regions surrounding the patterned area of the EUV mask by forming a non-reflective or "black" border around the die pattern area. In one proposed solution, the ML reflector is physically removed along die pattern border utilizing, for example, a plasma etch. While effectively eliminating reflectivity at the die pattern border, this solution requires the performance of multiple additional processing steps and entails the usage of aggressive etch chemistries, which can introduce defects into the EUV mask and reduce mask yield. In a second proposed solution, an additional light-absorbing layer is formed over the ML reflector along the die pattern border. This solution, however, requires the deposition and patterning of an additional film, which again adds undesired complexity, expense, and delay to the EUV mask fabrication process.

It would thus be desirable to provide embodiments of extreme ultraviolet mask fabrication process wherein the reflectivity of EUV light along the die pattern border is minimized in a manner that requires relatively few additional processing steps and which avoids the introduction of defects into the multi-layer reflector. It would further be desirable to provide embodiments of an extreme ultraviolet mask produced in accordance with such a method, as well as embodiments of a method suitable for fabricating a semiconductor device utilizing such an extreme ultraviolet mask. Other desirable features and characteristics of the present invention will become apparent from the subsequent detailed description and the appended Claims, taken in conjunction with the accompanying Drawings and the foregoing Technical Field and Background.

BRIEF SUMMARY

Embodiments of a method for fabricating an extreme ultraviolet (EUV) mask having a die pattern area are provided. In one embodiment, the method for fabricating an EUV mask includes obtaining an EUV mask blank including a substrate and a multi-layer (ML) reflector disposed over the substrate, and annealing localized portions of the ML reflector to produce an EUV light-absorptive border extending at least partially around an outer perimeter of the die pattern area.

Embodiments of a method for fabricating an integrated circuit are further provided. In one embodiment, the method includes providing a partially-fabricated integrated circuit having a process layer disposed over a semiconductor device, forming a photoresist layer over the process layer, and patterning the photoresist layer by exposure to extreme ultraviolet (EUV) light reflected from an EUV mask. The EUV mask includes a patterned absorber stack, a multi-layer (ML) reflector underlying the patterned absorber stack, and an EUV light-absorptive border formed at least partially around the outer perimeter of the EUV mask pattern by localized annealing of the ML reflector.

Embodiments of an extreme ultraviolet (EUV) mask having a die pattern area are further provided. In one embodiment, the EUV mask includes a substrate, a multi-layer (ML) reflector disposed over the substrate, an absorber stack formed over the ML reflector, and an EUV light-absorptive border formed at least partially around the outer perimeter of the EUV mask pattern by localized annealing of the ML reflector.

BRIEF DESCRIPTION OF THE DRAWINGS

The present invention will hereinafter be described in conjunction with the following drawing figures, wherein like numerals denote like elements, and wherein.

DETAILED DESCRIPTION

The following Detailed Description is merely exemplary in nature and is not intended to limit the invention or the application and uses of the invention. Furthermore, there is no intention to be bound by any expressed or implied theory presented in the preceding Technical Field, Background, Brief Summary, or the following Detailed Description.

Figure 1:
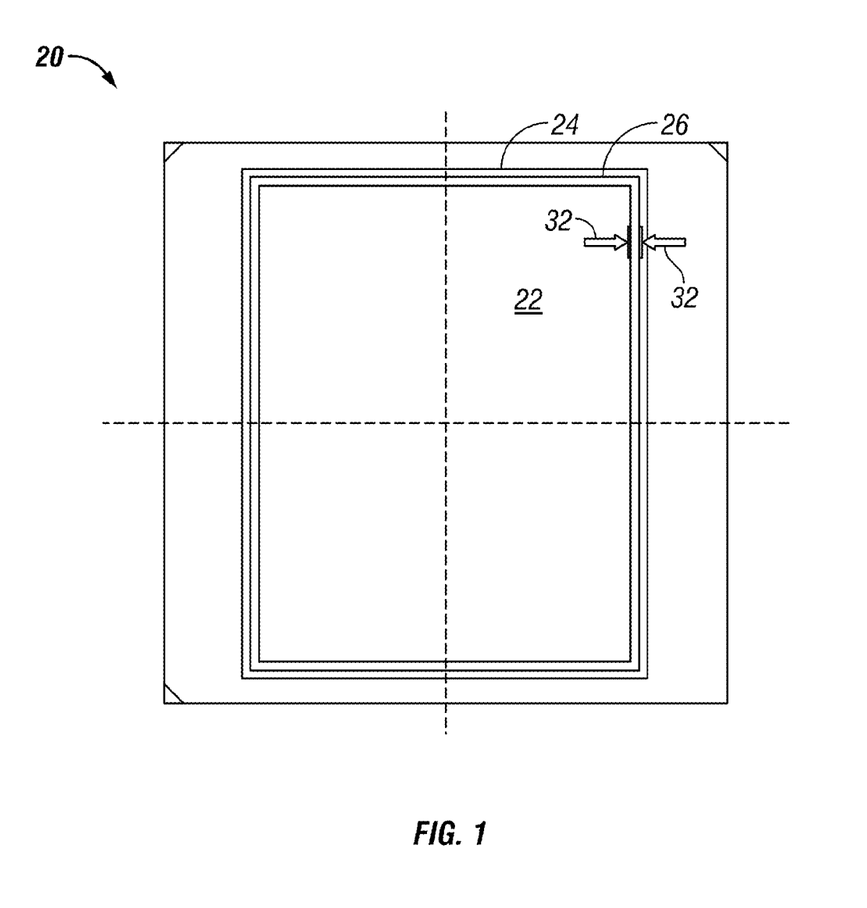
FIG. 1 is a top-down view of an extreme ultraviolet mask including an annealed light-absorptive border and illustrated in accordance with an exemplary embodiment of the present invention.

FIG. 1 is a top-down view of an extreme ultraviolet (EUV) mask 20 (also commonly referred to as a "reticle") illustrated in accordance with an exemplary embodiment of the present invention. EUV mask 20 is utilized in the performance of extreme ultraviolet lithography wherein extreme ultraviolet light ($\lambda$=~10 nm to ~14 nm) is utilized to transfer a circuit layout pattern from mask 20 to semiconductor die fabricated on a semiconductor wafer. The EUV wavelength selected for usage during EUV lithography will typically range from about 13.4 to about 13.6 nm and is preferably equivalent to about 13.5 nm. EUV mask 20 is imparted with the desired circuit layout by patterning of a die pattern area 22; i.e., the region of mask 20 in which a desired circuit layout will be patterned. As will be described in detail below, EUV mask 20 includes an absorber stack and a multi-layer reflector formed over the absorber stack. The absorber stack and multi-layer reflector are tuned to be predominately absorptive and reflective, respectively, of EUV light at the selected wavelength (e.g., ~13.5 nm). Patterning of die pattern area 22 (also commonly referred to as the "quality die area") is achieved through the controlled removal of the absorber stack to expose selected areas of the underlying multi-layer reflector corresponding to the desired circuit layout. During lithographical processing of a semiconductor die, EUV light is directed against the patterned face of EUV mask 20 to illuminate an exposure field 24 encompassing die pattern area 22. The exposed portions of the multi-layer reflector located within die pattern area 22 reflect, in substantial part, the EUV light impinging upon EUV mask 20 onto a photoresist layer deposited over a semiconductor die. Conventional lithographical techniques are then utilized to transfer the image from the photoresist to the semiconductor die. Depending upon the particular optical configuration of the photolithographical system utilized during EUV lithography, die pattern area 22 may be several times (e.g., three to four times) larger than the quality die area of the semiconductor die to which the desired circuit layout is ultimately transferred.

As noted in the foregoing section entitled "BACKGROUND," conventionally-produced EUV masks tend to reflect undesirably high amounts of EUV light near the border of the die pattern area due, at least in part, to incomplete absorption of EUV light by the patterned absorber stack. To overcome this limitation and provide near complete absorption of the EUV light at the border of the die pattern area, EUV mask 20 is fabricated to include an EUV light-absorptive border 26 (also referred to as a "black border") that extends at least partially around, and preferably fully circumscribes, die pattern area 22. As defined herein, the phrase "EUV light-absorptive" or, more simply, "light-absorptive" denotes a region or structure that reflects less than about 3% of incident light at a selected wavelength between about 10 and about 14 nm and, preferably, that reflects less than about 1% of incident light at a selected wavelength between about 13.4 and about 13.6 nm. Light-absorptive border 26 is formed through an annealing process wherein selected portions of the multi-layer reflector stack are rendered non-reflective utilizing a localized annealing process, such as laser annealing or focused ion beam annealing. A first exemplary process for fabricating EUV mask 20 is described below in conjunction with FIGS. 2-9, and an additional exemplary process for fabricating an EUV mask having annealed light-absorptive border is further described below in conjunction with FIGS. 10-15.

FIGS. 2-9 are simplified cross-sectional views of EUV mask 20 (FIG. 1) at various stages of manufacture and illustrated in accordance with a first exemplary embodiment of an EUV mask fabrication process wherein EUV light-absorbing border 26 (FIG. 1) is formed subsequent to EUV mask patterning. To commence the exemplary fabrication process, an EUV mask blank 34 is obtained by independent production or by purchase from a commercial supplier. In the exemplary embodiment shown in FIG. 2, EUV mask blank 34 includes a substrate 36, a multi-layer ("ML") reflector 38 formed over substrate 36, and an absorber stack 40 formed over ML reflector 38. Substrate 36 is preferably fabricated from a material having a relatively low co-efficient of thermal expansion, such as synthetic quartz. Although the thickness of substrate 36 may vary, in one embodiment, substrate 36 has a thickness of approximately 5.0 to 7.5 mm. In certain embodiments, a backside film can be formed over substrate 36 opposite ML reflector 38; e.g., a chromium nitride film can be deposited over the backside of substrate 36 to a thickness of, for example, about 70 nm.

Figure 2:
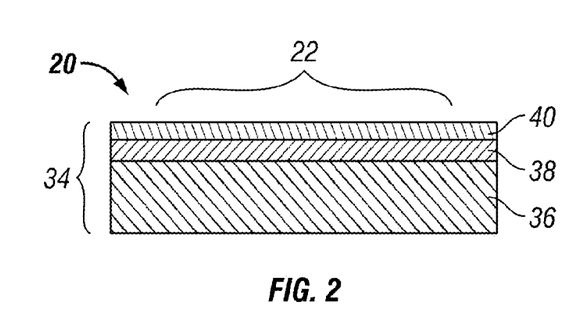
FIGS. 2-9 are simplified cross-sectional views of the extreme ultraviolet mask shown in FIG. 1 at various stages of manufacture and illustrated in accordance with a first exemplary embodiment of the extreme ultraviolet mask fabrication process wherein the annealed light-absorptive border is formed subsequent to mask patterning.

ML reflector 38 can include any number of layers formed from any material or group of materials, currently known or later developed, suitable for predominately reflecting incident EUV light at the selected wavelength (e.g., ~13.5 nm). In one common implementation, which has been shown to reflect upwards of 64% of incident EUV light at ~13.5 nm, ML reflector 38 is fabricated to include a relatively larger number of alternating molybdenum and silicon layers. More specifically, and by way of non-limiting example, ML reflector 38 can be fabricated to include approximately forty pairs of Mo/Si layers. In this exemplary case, the alternating Mo and Si layer can each have a thickness of about 2.78 and about 4.17 nm, respectively. In certain embodiments, ML reflector 38 may also be fabricated to include a capping layer (e.g., ruthenium) to help protect the alternating Mo/Si layers from any chemical etchants to which EUV mask blank 34 is exposed during mask processing.

Absorber stack 40 can include any number of layers formed from any material or group of materials, currently known or later developed, suitable for predominately absorbing incident EUV light at the selected wavelength (e.g., ~13.5 nm). The absorptivity of absorber stack 40 will vary in conjunction with thickness and composition; however, it is noted that, in embodiments wherein absorber stack 40 is fabricated to be relatively thin to reduce the above-described shadow effect and minimize horizontal-to-vertical bias in critical dimensions, absorber stack 40 may absorb approximately 97-98% of incident EUV light at the selected wavelength (e.g., ~13.5 nm). In many embodiments, absorber stack 40 will include a plurality of tantalum-comprising layers. More specifically, and as a first example, absorber stack 40 may include a tantalum boron nitride (TaBN) layer and an overlying tantalum boron oxide (TaBO) layer. In a thick configuration, the TaBN and TaBO layers may be deposited to thicknesses of, for example, 56 and 14 nm, respectively. In a thin configuration, the TaBN and TaBO layers may be deposited to thicknesses of, for example, 36 to 58 and 2 nm, respectively. In certain embodiments, a capping layer of chromium nitride may be formed over the TaBO layer having a thickness of, for example, 10 nm. As a second example, absorber stack 40 includes a tantalum nitride (TaN) layer and an overlying tantalum oxide (TaO) layer. In a thick configuration, the TaN and TaO layers may be deposited to thicknesses of, for example, 77 and 7 nm, respectively. In a thin configuration, the TaN and TaO layers may be deposited to thicknesses of, for example, 36 to 51 and 7 nm, respectively. Extreme ultraviolet mask blanks of the type described above are commercially available from Asahi Glass Co., Ltd., currently headquartered in Tokyo, Japan; and from Hoya Corporation also currently headquartered in Tokyo, Japan.

Figure 3:
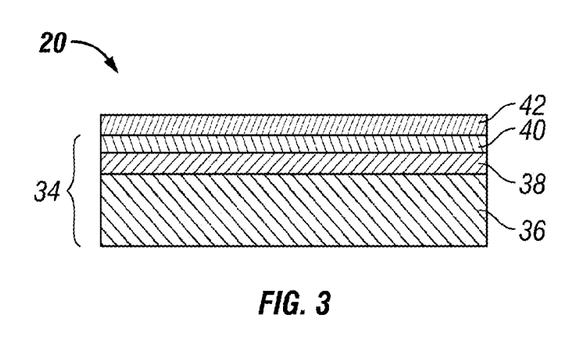
Figure 4:
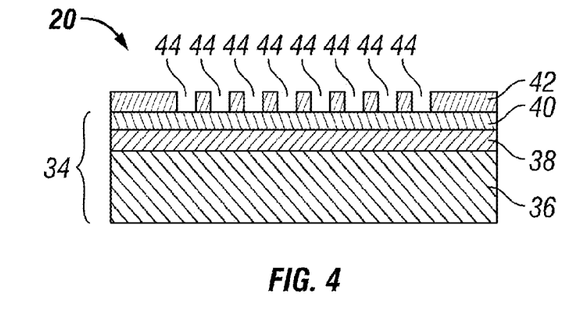
Figure 5:
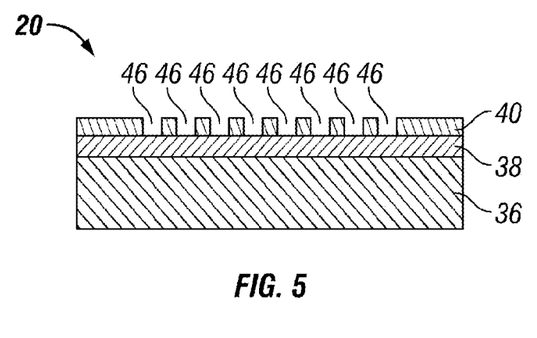

After EUV mask blank 34 has been purchased or otherwise obtained, die pattern area 22 (FIGS. 1 and 2) is imparted with a desired circuit layout utilizing conventional lithographical processing. For example, as illustrated in FIG. 3, photoresist 42 can be deposited over the upper surface of absorber stack 40. Photoresist 42 may then be exposed to an image pattern and treated with a developing solution to form pattern openings 44 within photoresist 42, as illustrated in FIG. 4. An anisotropic dry etch, such as a reactive ion etch, can then be performed utilizing a chemistry selected to etch absorber stack 40 to remove the areas of stack 40 exposed through pattern openings 44 and thereby create corresponding openings 46 within stack 40 through which selected regions of ML reflector 38 are exposed, as generally shown in FIG. 5.

While generally described above as a single layer of photoresist, it will be readily appreciated that photoresist 42 (and any other layer or structure referred to as a "photoresist" herein) can assume the form of a lithographical stack, such as a tri-layer lithographical stack including a photoresist layer, an optical planarization layer ("OPL"), and an anti-reflective coating ("ARC") layer. In this case, the photoresist layer may first be lithographically patterned, a first etch may then be performed to transfer the pattern to the underlying ARC and OPL layers, and then a second etch may be performed to transfer the pattern from the ARC and OPL layers to absorber stack 40 as previously described. Any remaining portion of the lithographical stack (e.g., the optical planarization layer) may then be stripped by ashing to yield the structure shown in FIG. 5.

Figure 6:
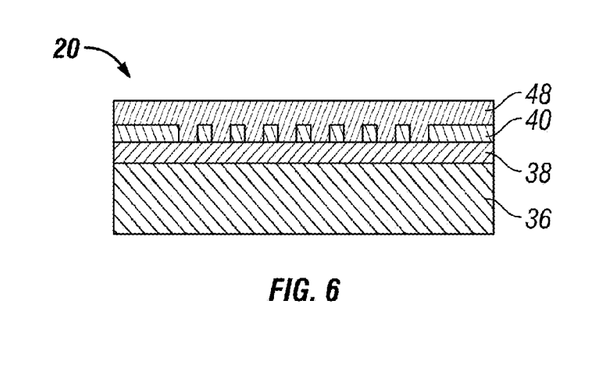
Figure 7:
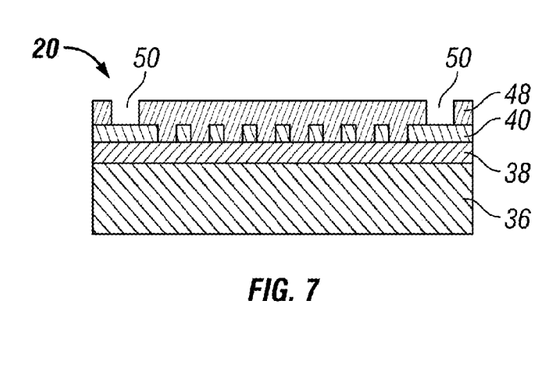
Figure 8:
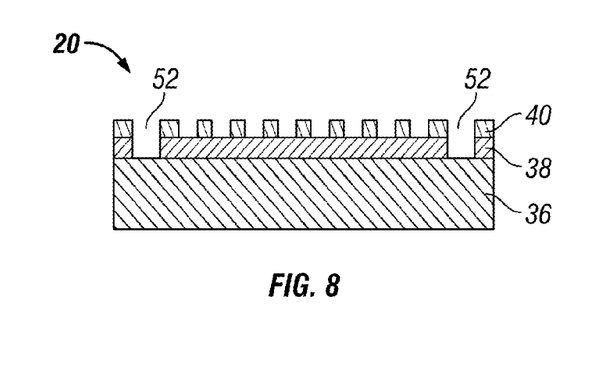

At this juncture in the fabrication process, EUV mask 20 (and, more specifically, die pattern area 22 identified in FIGS. 1 and 2) has been imparted with the desired circuit layout through the controlled removal of selected regions of absorber stack 40. Additional processing steps are now performed to form annealed light-absorptive border 26 within ML reflector 38 around the outer perimeter of die pattern area 22. With reference to FIG. 6, a second photoresist 48 is formed over the upper surface of absorber stack 40. Photoresist 48 is lithographically patterned to form at least one opening 50 through which an outer peripheral region of absorber stack 40 is exposed, as illustrated in FIG. 7. The outer peripheral region of the absorber stack 40 exposed through opening 50 is then removed utilizing an etching process, such as a reactive ion etch or other anisotropic dry etch, to create at least one opening 52 within stack 40 through which an outer peripheral portion of ML reflector 38 is exposed. Photoresist 48 is then removed to yield the structure shown in FIG. 8.

Figure 9:
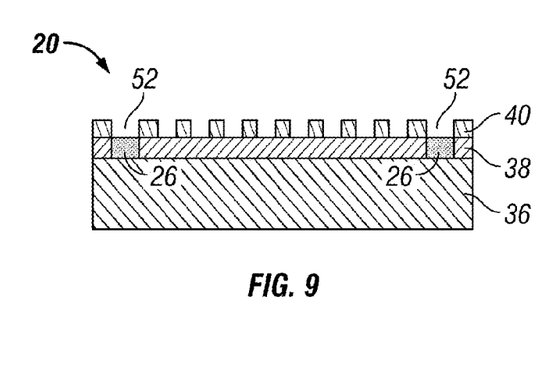

With reference to FIG. 9, a localized annealing process is next performed to damage the peripheral regions of ML reflector 38 exposed through openings 52 and thereby create EUV light-absorptive border 26 within ML reflector 38. During localized annealing, an energy beam is directed against the exposed border regions of ML reflector 38 to heat the exposed regions of reflector 38 to a predetermined temperature and thereby degrade, and preferably completely destroy, the reflectivity of reflector 38 at the selected EUV wavelength. Stated differently, localized annealing of ML reflector 38 is performed to change the resonance condition of the multi-layer grating and effectively shift the wavelength or wavelengths at which reflector 38 is predominately reflective away from the selected wavelength. Reflectivity of ML reflector 38 is largely determined by grating period, grating length (the number of pair layers), and the difference in refractive index in the Mo and Si layers. Layer inter-diffusion alerts the grating period and reduces the refractive index thereby shifting the resonance wavelength and reducing the reflectivity of ML reflector 38 at the selected EUV wavelength. By increasing the thermal load of ML reflector 38, the diffusion process is accelerated and the peak reflective wavelength of ML reflector 38 is shifted. Testing has demonstrated that a Mo/Si ML reflector having a peak reflectivity of approximately 60% at ~13.5 nm can be reduced to less than 2% at ~13.5 nm by annealing. Localized annealing should be distinguished from global annealing processes, such as oven or hot plate annealing, which would affect the entire ML reflector and decrease the overall efficacy of EUV mask 20.

The localized annealing process is preferably controlled to heat the exposed regions of the ML reflector 38 with a relatively high power in a relatively short period of time. The predetermined temperature to which the exposed border regions of the ML reflector 38 are heated during the localized anneal will vary in conjunction with the composition and structure of ML reflector 38. In embodiments wherein ML reflector 38 includes a plurality of alternating molybdenum and silicon layers, the Mo/Si layers are preferably heated to temperature sufficient to include the formation of a molybdenum silicide at the layer-to-layer interfaces of the neighboring the Mo/Si layers; e.g., the alternating Mo/Si layers may be heated to a predetermined temperature exceeding about 200° C. or, more preferably, exceeding about 300° C. during the localized annealing process. Localized annealing of the peripheral regions of ML reflector 38 surrounding or bordering the die pattern area can be accomplished utilizing a laser annealing process or a focused ion beam annealing process, to provide but two examples. The reflectivity of the damaged areas of ML reflector 38 is preferably decreased to less than 1%; more preferably, to less than 0.5%; and, still more preferably, to less than 0.1% pursuant to localized annealing. By way of non-limiting example, the wall thickness of EUV light-absorptive border 26 may range between approximately 0.8 and approximately 3.0 millimeters (mm), as indicated in FIG. 1 by arrows 32. The wall thickness of EUV light-absorptive border 26 may be uniform along the entire length of border 26 or, instead, may vary within certain prescribed limits to accommodate smaller dies. During localized annealing, the energy beam may be pulsed at relatively short durations of a few fractions of a second, while the entire annealing process may take several minutes to complete.

In the illustrated exemplary embodiment, and as may be appreciated most easily by referring to FIG. 1, EUV light-absorptive border 26 extends entirely around the outer perimeter of patterned area of EUV mask 20, when considered from a top-down or planform perspective. As can further be seen in FIG. 1, EUV light absorptive border 26 has a generally rectangular planform shape, which is conformal with and encompasses die pattern area 22. Opening 50 formed in photoresist 48 (shown in FIG. 7) and opening 52 formed in absorber stack 4 (shown in FIG. 8) will likewise assume the form of a continuous rectangular trench or channel extending around the outer perimeter of die pattern area 22. However, in further embodiments, EUV light-absorptive border 26 may not extend entirely around the outer perimeter of die pattern area 22 to form a closed rectangle. Instead, EUV light-absorptive border 26 may only be formed along three or fewer sides of the border region surrounding die pattern are 22 to form a U- or L-shaped structure. In still further embodiment, EUV light-absorptive border 26 may be comprised of multiple discrete or broken regions of ML reflector 38 damaged by the above-described annealing process and spaced along the outer perimeter of die pattern area 22.

The foregoing has thus provided an exemplary embodiment of a method for forming an extreme ultraviolet mask wherein peripheral regions of the EUV mask are damaged and rendered non-reflective utilizing, for example, laser annealing or focused ion beam annealing to create an EUV light-absorptive border integrally formed within a multi-layer reflector. While, in the exemplary embodiment described above, the annealing process was performed after patterning of the die pattern area, localized annealing of the multi-layer can be performed prior to mask patterning in alternative embodiments. For example, in further embodiments, EUV light-adsorptive border 26 can be formed within ML reflector 38 before patterning of the die pattern area by performing the steps shown in FIGS. 6-9 prior to the steps shown in FIGS. 3-5. In still further embodiments, the EUV light absorptive border may be formed within the ML reflector prior to the formation of the absorber stack, as described below in conjunction with FIGS. 10-15.

Figure 10:
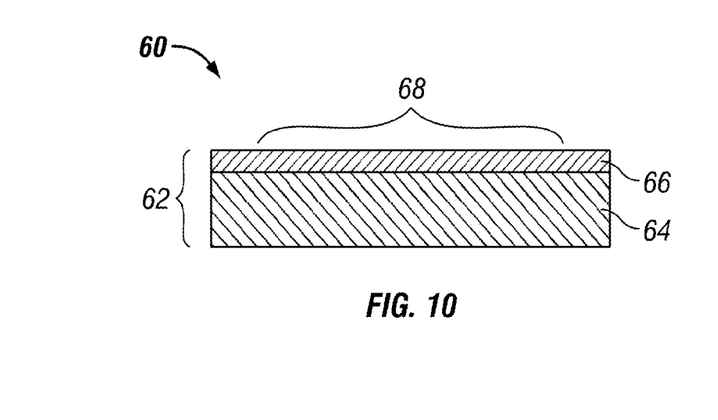
FIGS. 10-15 are simplified cross-sectional views of an extreme ultraviolet mask at various stages of manufacture and illustrated in accordance with a second exemplary embodiment of the extreme ultraviolet mask fabrication process wherein the annealed light-absorptive border is formed prior to mask patterning.
Figure 11:
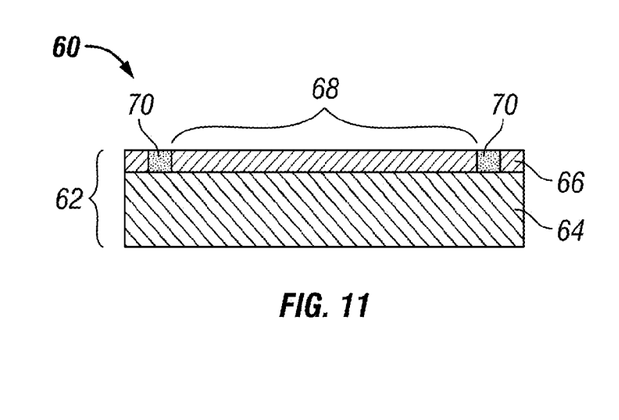

FIGS. 10-15 are simplified cross-sectional views of an extreme ultraviolet mask 60 at various stages of manufacture and illustrated in accordance with a second exemplary embodiment of the extreme ultraviolet mask fabrication process. As was the case previously, the exemplary EUV mask fabrication process commences with the provision of an extreme ultraviolet mask blank 62. As shown in FIG. 10, EUV mask blank 62 includes a substrate 64 and a multi-layer ("ML") reflector 66 formed over substrate 64. Substrate 64 and ML reflector 66 may be substantially identical to substrate 36 and ML reflector 38 described above in conjunction with FIGS. 2-9, respectively, and will consequently not be described in detail to avoid redundancy. In contrast to EUV mask blank 34 described above in conjunction with FIGS. 2-4, EUV mask blank 62 does not include an absorber structure disposed over ML reflector 66. Localized annealing of ML reflector 66 along a border region circumscribing the die pattern area (identified in FIGS. 10 and 11 at 68) may consequently be performed utilizing, for example, a laser or focused ion beam. As indicated above, localized annealing of the outer peripheral portion of ML reflector 66 results in the formation of an EUV light-absorptive border 70 within reflector 66, which at least partially surrounds and preferably fully circumscribes die pattern area 68, when viewed from a top-down or planform perspective.

Figure 12:
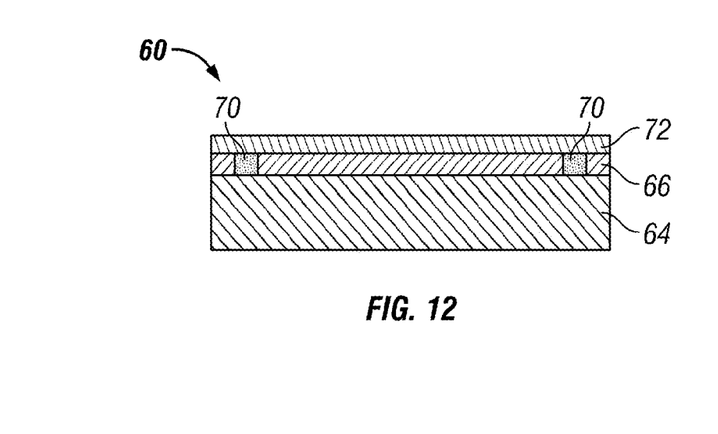
Figure 13:
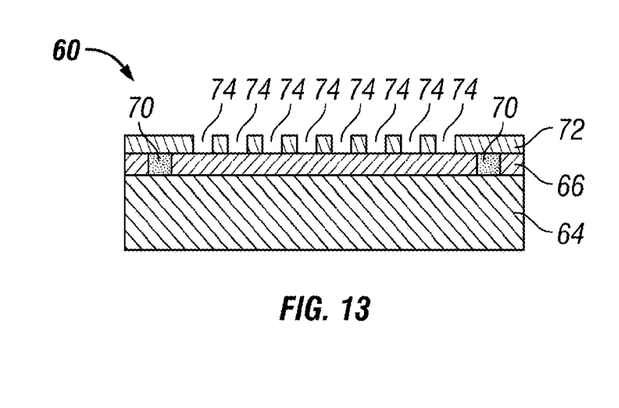
Figure 14:
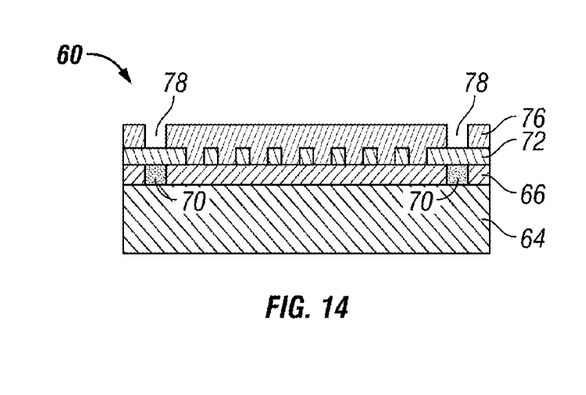
Figure 15:
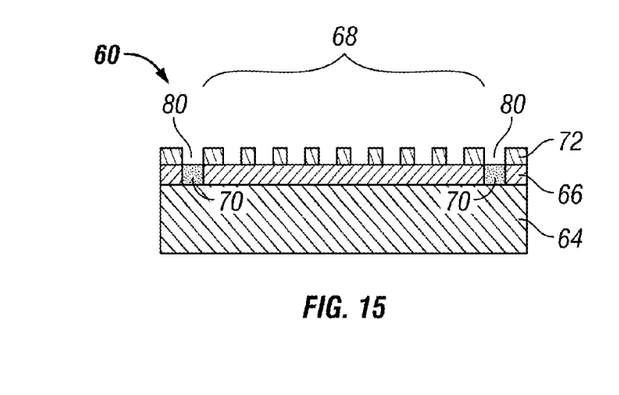

With reference to FIG. 12, an absorber stack 72 is formed over ML reflector 66 and EUV light-absorptive border 70 after the formation of EUV light-absorptive border 70. Absorber stack 72 is then lithography patterned to form a plurality of openings 74 therein, as generally shown in FIG. 13. In this manner, selected areas of ML reflector 66 are exposed through absorber stack openings 74 corresponding to the desired circuit layout. As EUV mask 60 has now been patterned, mask 60 may now be utilized to carry-out EUV lithography. In embodiments wherein absorber stack 72 is formed to be relatively thin, a certain amount of EUV light may penetrate through absorber stack 72 during EUV lithography, impinge on the underlying region of ML reflector 66, and ultimately be reflected from EUV mask 60. Thus, although covered by absorber stack 72, light-absorptive border 70 may advantageously reduce the amount of light reflected by absorber stack 72 around the perimeter of die pattern area 68. Consequently, in certain embodiments, the exemplary mask fabricating process may conclude after patterning of EUV mask 60, in which case the finished EUV mask will include a light-absorptive border 70 underlying absorber stack 72, as shown in FIG. 13. Alternatively, additional patterning and etching steps can be performed to etch one or more openings through absorber stack 72 and thereby expose light-absorptive border 70. For example, as shown in FIG. 14, photoresist 76 may be deposited over absorber stack 72 and lithographically patterned to create openings 78 in photoresist 76 to expose the outer peripheral region of absorber stack 72 overlying light-absorptive border 70. A reactive ion etch or other anisotropic dry etch can then be performed to remove the areas of absorber stack 72 overlying light-absorptive border 70 and create openings 80 within stack 72 exposing border 70. In embodiments wherein light-absorptive border 70 is more effective in absorbing EUV light at the selected wavelength than is absorber stack 72, creating additional etch openings through absorber stack 72 to expose border 70 may decrease undesired reflection along the outer regions of die pattern area 68.

The foregoing has thus provided exemplary embodiments of a method for forming an extreme ultraviolet mask wherein peripheral regions of the EUV mask are damaged and rendered non-reflective utilizing, for example, laser annealing or focused ion beam annealing to create an EUV light-absorptive border within the multi-layer reflector. By imparting the EUV mask with such a light-shield or black border, the reflectivity of EUV light along the die pattern border is minimized in a manner that requires relatively few additional processing steps and which avoids the introduction of defects into the multi-layer reflector. As a further advantage, the EUV-light absorptive border can be integrated into currently-known mask fabrication process flows prior to or subsequent to mask patterning. It is also noted that, performing the steps described above in conjunction in FIGS. 10-12, embodiments of the exemplary EUV mask fabrication process can also be utilized to produce EUV mask blanks having annealed light-absorptive borders.

Figure 16:
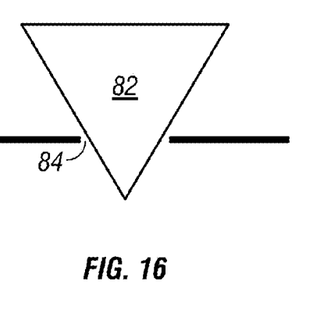
FIGS. 16 and 17 generically illustrate the manner in which an energy beam can be directed through an aperture and a diffuser, respectively, during the annealing process to control beam intensity and profile at the multi-layer reflector.
Figure 17:
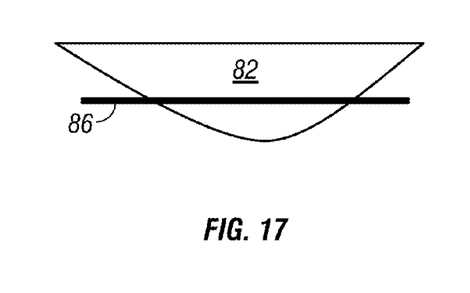
Figure 18:
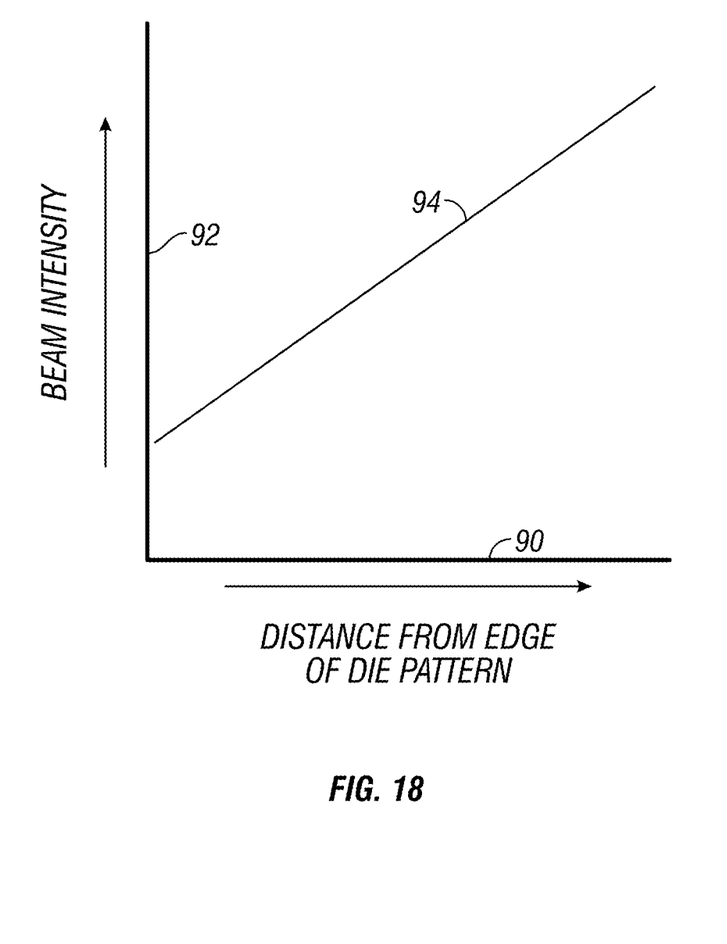
FIG. 18 is a graph illustrating one exemplary manner in which energy beam intensity can be increased with decreasing proximity to an outermost edge of the die pattern area to produce an annealed light-absorptive border having varied reflectivity allowing for sharper edges.

In the above-described exemplary embodiments, localized portions of a multilayer reflector included within an extreme ultraviolet mask were exposed to pulsed energy beams, such as one or more laser beams or focused ion beams, to produce a light-absorptive border extending at least partially around an outer perimeter of the die pattern area. Ideally, during the annealing process, the energy beam is controlled to impart the EUV light-absorptive border with relatively sharp edges or vertical sidewalls. In this regard, and as generically illustrated in FIG. 16, the profile of an energy beam 82 may be controlled by passing the energy beam through an aperture 84 prior to impingement on the treated areas of the ML reflector. Furthermore, the size of aperture 84 can be adjusted during the annealing process to alter the wall thickness of the light-absorptive border and/or to control the intensity of the energy beam, as appropriate. In addition to or in lieu of an aperture, energy beam 82 may be directed through one or more optical filters, such as a diffuser 86 shown in FIG. 17, to adjust the intensity of the energy beam incident on the targeted areas of the ML reflector. The foregoing notwithstanding, it will be appreciated that the two dimensional or linear beam profiles shown in FIGS. 17 and 18 are simplified representations of an exemplary energy beam and that actual beam profile will vary in conjunction with various process parameters, including timing, beam energy, and thermal conductivity. In the case of a laser beam, specifically, a sharp beam profile may be achieved in certain embodiments through the usage of a flat-top beam (i.e., a transformed laser beam having an intensity profile that is flat over the majority of the covered area) and/or through the usage of an apparatus capable of delivering a defocused laser beam having a sharp-edge cross-section, such as the apparatus described in U.S. Pat. No. 5,336,216, entitled "APPARATUS FOR DELIVERING A DEFOCUSED LASER BEAM HAVING A SHARP-EDGED CROSS-SECTION" issued Aug. 9, 1994, to Dewey. In further embodiments, a Gaussian-type laser beam may be utilized, possibly in conjunction with scanning method described below.

In one embodiment of the EUV mask fabrication method, a relatively narrow laser beam or focused ion beam created by, for example, passage of the beam through a relatively small aperture or slit is scanned across the surface of the targeted areas of the ML reflector during the annealing process. The scanning motion can be accomplished by movement of the beam, by movement of the mask, or by a combination of the two. The scanning motion is preferably controlled such that the energy beam initially strikes or impinges adjacent the outermost edges of the die pattern area and then moves gradually away therefrom in a sweeping movement. In this case, the intensity of the energy beam or energy beam pulses is preferably controlled to be relatively low when the beam strikes adjacent the outermost edges of the die pattern area and is gradually increased as the beam moves away therefrom. Stated differently, the intensity of the beam is increased with increasing distance from the outermost edges of the die pattern area or the innermost edges of the annealed light-absorptive border. In embodiments wherein the multi-layer reflector includes or consists of alternating layers of molybdenum and silicon, the energy beam is preferably controlled to deliver the minimum energy dosage required to initiate formation of molybdenum silicide adjacent the outermost edges of the die pattern area, and the intensity of the energy beam is gradually increased as the beam sweeps across the border area in a direction away from the die pattern area. Such an annealing process is graphically expressed in FIG. 18 wherein the horizontal axis 90 represents distance of the energy beam from the die pattern edge, wherein the vertical axis 92 represents laser beam intensity, and wherein curve 94 indicates the manner in which beam intensity is gradually increased within increasing distance from the die pattern edge.

The foregoing has also provided a method for fabricating an integrated circuit utilizing an extreme ultraviolet mask. In one embodiment, the method commences with the step of providing a partially-fabricated integrated circuit having a process layer disposed over a semiconductor device. The term "process layer" is utilized herein to encompass dielectric layers, silicon layers, metal layers, and the like. A photoresist layer is then formed over the process layer. The photoresist layer is then patterned by exposure to EUV light reflected from the EUV mask. As described above, the EUV mask may include a patterned absorber stack, a ML reflector underlying the patterned absorber stack, and an EUV light-absorptive border formed at least partially around the outer perimeter of the EUV mask pattern by localized annealing of the ML reflector.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing the exemplary embodiment or exemplary embodiments. It should be understood that various changes can be made in the function and arrangement of elements without departing from the scope of the invention as set forth in the appended Claims and the legal equivalents thereof.

What is claimed is:

1. A method for fabricating an extreme ultraviolet (EUV) mask having a die pattern area, the method comprising:
   obtaining an EUV mask blank including a substrate and a multi-layer (ML) reflector disposed over the substrate; and
   annealing localized portions of the ML reflector to produce an EUV light-absorptive border extending at least partially around an outer perimeter of the die pattern area, wherein annealing comprises exposing the localized portions of the ML reflector to an energy beam to form the EUV light-absorptive border within the ML reflector, wherein exposing comprises:
   directing the energy beam to strike an area of the ML reflector adjacent an outermost edge of the die pattern area; and
   scanning the energy beam across the ML reflector in a direction substantially away from the die pattern area, and wherein scanning comprises scanning the energy beam across the ML reflector while increasing the intensity of the energy beam with increase distance from the outermost edge of the die pattern area.

2. A method according to claim 1 wherein the ML reflector comprises at least one molybdenum layer adjacent at least one silicon layer, and wherein annealing comprises heating the localized portions of the ML reflector to a predetermined temperature to produce molybdenum silicide along an interface of the molybdenum and silicon layers.

3. A method according to claim 2 wherein heating comprises heating the localized portions of the ML reflector to a temperature exceeding about 200° Celsius to initiate formation of molybdenum silicide.

4. A method according to claim 1 further comprising:
passing the energy beam through an aperture prior to impingement on the ML reflector; and
adjust the size of the aperture while exposing the localized portions of the ML reflector to the energy beam to vary at least one of the energy beam intensity and the wall thickness of the EUV light-absorptive border.

5. A method according to claim 1 further comprising passing the energy beam through an aperture prior to impingement of the energy beam on the ML reflector to impart the EUV light-absorptive border with a predetermined wall thickness.

6. A method according to claim 1 wherein exposing comprises exposing the localized portions of the ML reflector to one of the group consisting of a laser beam and a focused ion beam.

7. A method according to claim 1 wherein obtaining comprises obtaining an EUV mask blank including a substrate, a multilayer (ML) reflector disposed over the substrate, and an absorber stack formed over the ML reflector.

8. A method according to claim 7 further comprising patterning the absorber stack to expose a region of the ML reflector bordering the die pattern area.

9. A method according to claim 8 wherein annealing comprises annealing the region of the ML reflector exposed through the absorber stack to produce an EUV light-absorptive border within the ML reflector extending at least partially around an outer perimeter of the die pattern area.

10. A method according to claim 7 further comprising forming an absorber stack over the ML reflector after annealing localized portions of the ML reflector to produce an EUV light-absorptive border within the ML reflector extending at least partially around an outer perimeter of the die pattern area.

11. A method according to claim 10 further comprising etching the absorber stack to expose the EUV light-absorptive border through the absorber stack.

12. An extreme ultraviolet (EUV) mask having a die pattern area, the EUV mask comprising:
a substrate;
a multi-layer (ML) reflector disposed over the substrate;
an absorber stack formed over the ML reflector; and
an EUV light-absorptive border formed at least partially around an outer perimeter of the EUV mask pattern by localized annealing of the ML reflector, wherein the ML reflector comprises a molybdenum layer and a silicon layer adjacent the molybdenum layer, wherein the EUV light-absorptive border comprises molybdenum silicide, and wherein the molybdenum silicide formed across the EUV light-absorptive border increases with increase distance from an outermost edge of the die pattern area.

13. An EUV mask according to claim 12 further comprises at least one etch opening formed in the EUV light-absorptive stack through which the EUV light-absorptive border is exposed.

* * * * *